(12) United States Patent
Ooishi et al.

(10) Patent No.: US 6,503,849 B1
(45) Date of Patent: Jan. 7, 2003

(54) METHOD FOR FORMING INSULATING FILM

(75) Inventors: Yoshihiro Ooishi, Ikoma-gun (JP); Yushi Inoue, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 86 days.

(21) Appl. No.: 09/680,951

(22) Filed: Oct. 10, 2000

(30) Foreign Application Priority Data

Dec. 28, 1999 (JP) ............................................. 11-372116

(51) Int. Cl.$^7$ .......................... H01L 21/02; H01L 21/31; H01L 21/469; B05D 3/02
(52) U.S. Cl. ...................... 438/781; 438/623; 438/624; 438/782; 438/783; 427/226; 427/294; 427/350; 427/374.1; 427/374.6; 427/374.7; 427/376.2; 427/377; 427/398.1
(58) Field of Search ................. 427/226, 294, 427/350, 374.1, 374.6, 374.7, 376.2, 377, 398.1; 438/623, 624, 781, 782, 783

(56) References Cited

U.S. PATENT DOCUMENTS

| 4,330,514 A | * | 5/1982 | Nagai et al. ................... 106/35 |
| 5,118,530 A | * | 6/1992 | Hanneman et al. ...... 106/31.58 |
| 5,372,842 A | * | 12/1994 | Mine et al. .............. 427/126.2 |

FOREIGN PATENT DOCUMENTS

JP    Hei 9(1997)-283515    10/1997

OTHER PUBLICATIONS

JPO machine translation of JP 09–283515 (Oct. 1997).*

* cited by examiner

Primary Examiner—Shrive P. Beck
Assistant Examiner—Michael Cleveland
(74) Attorney, Agent, or Firm—Nixon & Vanderhye P.C.

(57) ABSTRACT

A method for forming an insulating film, wherein a precursor film of a coating type insulating film having Si—H bonding is coated, the precursor film is calcined in an atmosphere containing at least one of an inert gas and oxygen gas for converting it into a ceramic film as the insulating film, and then the ceramic film is cooled under reduced pressure lower than that for the calcination.

11 Claims, 3 Drawing Sheets

METHOD FOR FORMING INSULATING
FILM

CROSS-REFERENCE TO RELATED APPLICATION

This application is related to Japanese application No. HEI 11 (1999)-372116 filed on Dec. 28, 1999, whose priority is claimed under 35 USC §119.

BACKGROUND OF THE INVENTION

1. Field of the Invention

The present invention relates to a method for forming an insulating film. More specifically, it relates to a method for forming a coating type insulating film having Si—H bonding. The coating type insulating film includes an inorganic SOG (Spin On Glass) film which is particularly suitable as an insulating film, e.g., an interlayer insulating film and a protective film, in semiconductor devices. The present invention can prevent the generation of microscopic projections on the surface of the coating type insulating film having the Si—H bonding by calcining and exposing a resin film to form the insulating film under reduced pressure for converting the resin film into a ceramic film.

2. Description of Related Art

Inorganic coating type insulating films having Si—H bonding have been conventionally provided by coating, baking and calcination. Specifically, a resin film is formed (coated) to cover a surface of a semiconductor substrate by spin coating or the like. Then, a thermal treatment (baking) is performed in an atmosphere of an inert gas such as $N_2$, followed by calcination in an atmospheric pressure oven or a reduced pressure oven. Thus, an insulating film is formed.

According to such a method, an inorganic SOG film having the Si—H bonding and a thickness of 1 μm or more can be obtained without cracks. The thus formed inorganic SOG film (silicon oxide film) is suitable as an insulating film, such as an interlayer insulating film, a protective film and the like, in a semiconductor device.

A method of forming multilayer wirings according to a prior art technique is shown in FIGS. 3(a) to 3(d).

In the step shown in FIG. 3(a), a wiring layer 16 is formed on an insulating film 14 of silicon oxide or the like which covers an entire surface of a semiconductor substrate 12, and then a solution prepared by dissolving a hydrogen silsesquioxane resin into MIBK (methyl isobutyl keton) is spin-coated to form a resin film 18 which alleviates level difference due to the insulating film 14 and the wiring layer 16.

In the step shown in FIG. 3(b), the resin film 18 is thermally treated under an inert gas atmosphere to convert the resin film 18 into a pre-ceramic silicon oxide film 18a. Next, the silicon oxide film 18a is thermally treated in a mixed atmosphere of $O_2$ gas and an inert gas to convert the silicon oxide film 18a into a ceramic silicon oxide film 18b. At this time, a microscopic projection 18c of about 0.1 μm in diameter is generated on the surface of the ceramic silicon oxide film 18b.

In the step shown in FIG. 3(c), an insulating film 20 made of silicon oxide is formed by plasma CVD method to cover the ceramic silicon oxide film 18b. Then, the insulating film is planarized by chemical mechanical polishing (CMP) method.

One of drawbacks accompanying the thus generated microscopic projection 18c is that a precise contact hole cannot be formed as shown in FIG. 3(d). According to the above-described conventional technique, the yield of the formation of wirings is reduced since the microscopic projection of about 0.1 μm in diameter is generated on the surface of the ceramic inorganic SOG film having the Si—H bonding.

In the step shown in FIG. 3(d), a contact hole 24 extending to the wiring layer 16 is formed by s elective dry etching (anisotropic etching) using a resist layer 22 as a mask. Thereafter, an ashing treatment is performed to remove the resist layer 22, followed by washing. During this step, the microscopic projection 18c and its neighborhood are overetched since they are characteristically weak against the etching. As a result, a concave portion 25 is generated on the sidewall of the contact hole 24.

Then, a wiring material layer is formed on the surface of the substrate and patterned to form a wiring layer contacting the wiring layer 16. The coverage of the thus formed wiring layer is deteriorated at the concave portion 25 in the contact hole 24, which reduces reliability.

To solve the above-mentioned drawback, Japanese Unexamined Patent Publication No. Hei 9 (1997)-283515 discloses a method of preventing the generation of the microscopic projection on the surface of the silicon oxide film by thermally treating a pre-ceramic silicon oxide film for converting into a ceramic film in an atmosphere containing $O_2$ and $N_2$ at a temperature of 250° C. to 400° C.

However, even though the above method is utilized, mechanical strength of the ceramic silicon oxide film is unsatisfactory. Further, when a passivation film is formed after the calcination for forming an SOG film, silane type gas (Si—H) eliminated from the SOG film is confined between the SOG film and the passivation film, which induces the film exfoliation.

Further, if the calcination for forming the SOG film is performed in a reduced pressure oven, the silane type gas (Si—H) is excessively eliminated during calcination, which renders the SOG film fragile.

SUMMARY OF THE INVENTION

An object of the present invention is to provide a novel method for forming a silicon oxide film, which is capable of preventing the generation of microscopic projections without reducing the mechanical strength of the silicon oxide film.

According to the method for forming the insulating film of the present invention, a precursor film of a coating type insulating film having Si—H bonding is coated, the precursor film is calcined in an atmosphere containing at least one of an inert gas and oxygen gas for converting it into a ceramic film as the insulating film, and then the ceramic film is cooled under reduced pressure lower than that for the calcination.

The calcining atmosphere can be selected from an inert gas atmosphere, an oxygen gas atmosphere and a mixed atmosphere containing the two gases, depending on the kind of precursor film of the insulating film, material constituting the insulating film and the like.

According to the method for forming the insulating film of the present invention, after the calcination of the precursor film, the pressure is reduced preferably to $1 \times 10^{-1}$ Pa or more to $1 \times 10^{+3}$ Pa or less.

Further, according to the method for forming the insulating film of the present invention, after the calcination of the precursor film, the temperature is preferably lowered to 200° C. to 350° C. under the reduced pressure.

Still further, according to the method for forming the insulating film of the present invention, the pressure at the calcination of the precursor film for converting it into the ceramic film is desirably $0.07 \times 10^{+6}$ Pa or more to $0.13 \times 10^{+6}$ Pa or less.

The present invention can be applied to a method of forming an inorganic SOG film having the Si—H bonding which comprises the steps of performing a first thermal treatment for converting a precursor film of the inorganic SOG film into a pre-ceramic film in an atmosphere containing at least one of an inert gas and oxygen gas, performing a second thermal treatment for calcining the pre-ceramic film into a ceramic film in an atmosphere containing at least one of an inert gas and oxygen gas, and reducing pressure after the calcination by the thermal treatment. The film characteristics of the resulting film can be stabilized by performing the step of forming the pre-ceramic precursor film.

According to the present invention, the generation of the microscopic projections can be prevented because the pressure is reduced after the calcination. The lower limit of the pressure is set to $1 \times 10^{-1}$ Pa because if the pressure reduced after the calcination is less than $1 \times 10^{-1}$ Pa, the mechanical strength of the resulting film falls behind that of the insulating film formed under atmospheric pressure. In the method of the present invention, the temperature for converting the precursor film into the pre-ceramic film is preferably in the range of 250° C. to 400° C. Within the temperature range, the precursor film can be converted into the pre-ceramic film by about 1 minute heating.

In the method of the present invention, the thermal treatment for forming the pre-ceramic film can be omitted so that a hydrogen silsesquioxane resin film (precursor film), which serves as the precursor film, can be formed into a ceramic silicon oxide film by one thermal treatment. In this case, the thermal treatment can be performed in an atmosphere containing at least one of an inert gas and oxygen gas at a temperature ranging from 250° C. to 400° C. As a result, the ceramic silicon oxide film having desired mechanical strength can be obtained without the microscopic projection.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
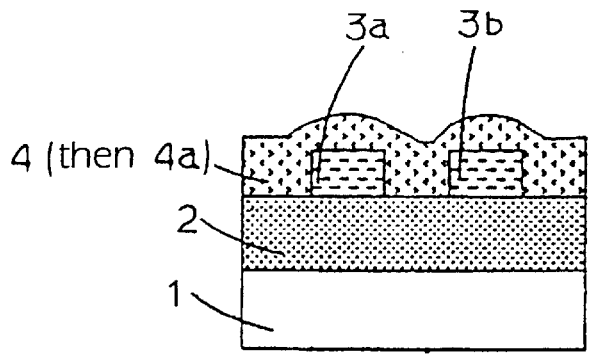
FIGS. 1(a) to 1(e) are sectional views for illustrating the steps of forming an insulating film according to the present invention.
Figure 1D:
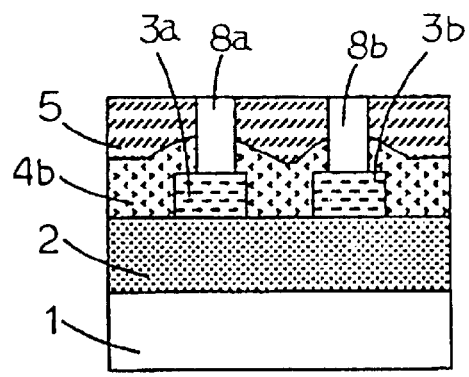
Figure 1B:
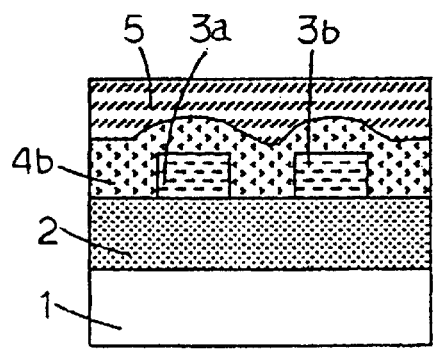
Figure 1E:
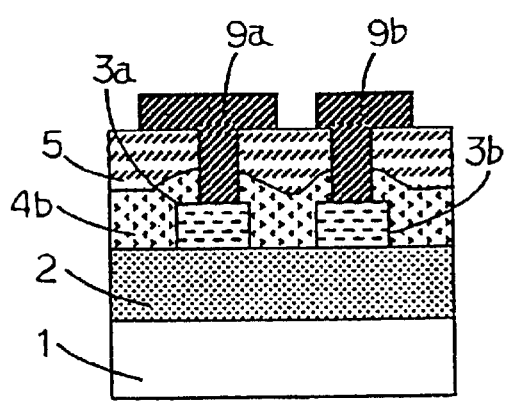
Figure 1C:
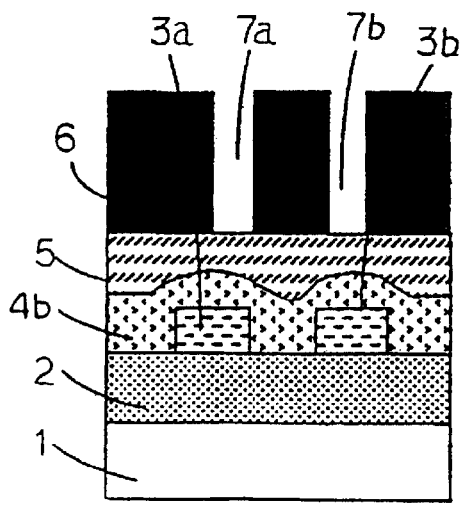
Figure 2:
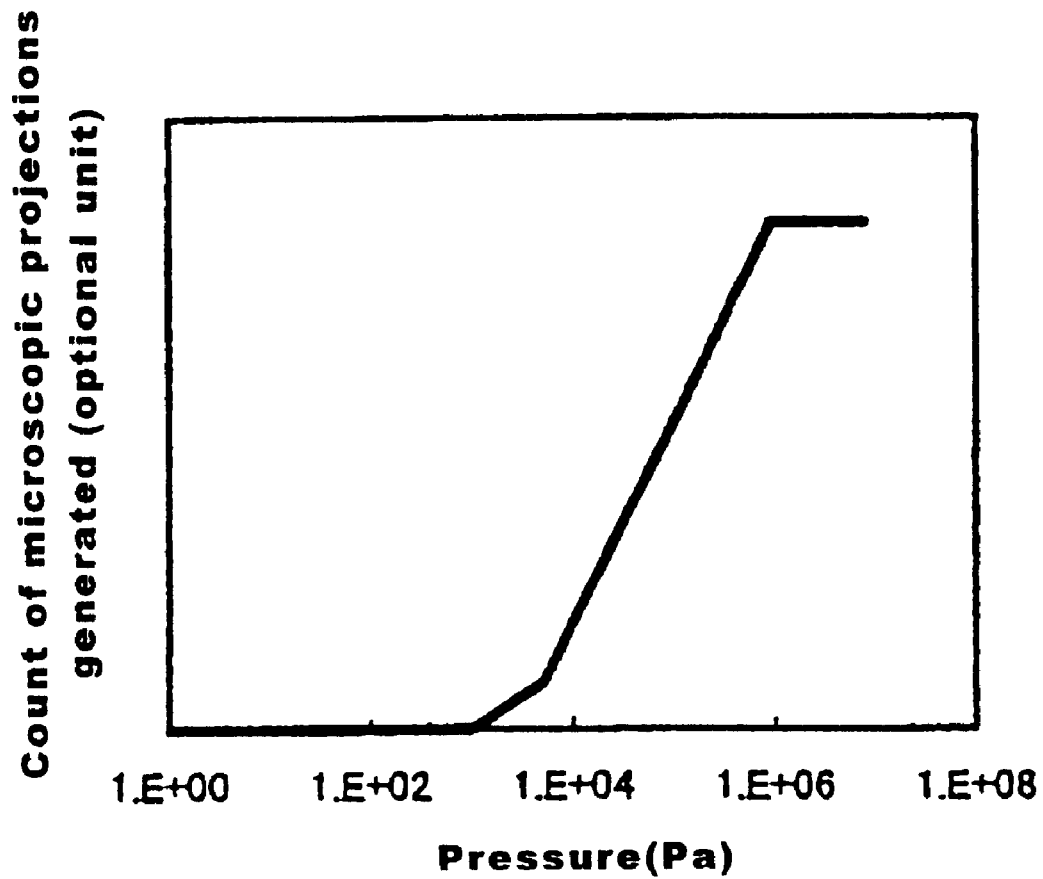
FIG. 2 is a graph illustrating a relationship between the pressure reduced after the calcination and the count of microscopic projections generated.

FIGS. 1(a) to 1(e) are sectional views for illustrating steps of forming an insulating film according to the present invention and FIG. 2 is a graph illustrating a relationship between the pressure reduced after the calcination and the count of microscopic projections generated. In FIGS. 1(a) to 1(e), reference numeral 1 denotes a semiconductor substrate, 2 an interlayer insulating film, 3a and 3b are first wiring layers, 4 denotes a resin film, 4a a pre-ceramic silicon oxide film, 4b a ceramic silicon oxide film, 5 an insulating film, 6 a resist layer, 7a and 7b are first contact holes, 8a and 8b are second contact holes, and 9a and 9b are second wiring layers.

Hereinafter, the steps of forming the insulating film according to an embodiment of the present invention will be explained with reference to FIGS. 1(a) to 1(e).

First, on a surface of a semiconductor substrate 1 of silicon on which devices such as transistors have been formed (not shown), an interlayer insulating film 2 of BPSG (boron/ phosphorus/ silicate glass) is formed by atmospheric CVD method or the like.

Then, a wiring material layer is formed on the top surface of the semiconductor substrate (silicon substrate) 1 by sputtering method or the like and the layer is patterned by selective dry etch to form first wiring layers 3a and 3b.

In the next step, a resin film 4, which serves as a precursor film of a coating type insulating film (an inorganic SOG film) having Si—H bonding, is formed thereon to alleviate level difference caused by the first wiring layers 3a and 3b (FIG. 1 (a)). In this step, the resin film was formed in a thickness of 400 nm by coating a solution prepared by dissolving a hydrogen silsesquioxane resin (sold by Dow Corning under the tradename FOX-15) in MIBK, onto the semiconductor substrate using a spin coater. The thickness of the resin film 4 can be selected as required within the range of 300 to 600 nm.

To form the resin film 4 to alleviate the level difference, the solution containing the dissolved resin was coated while rotating the semiconductor substrate 1 using the spin coater. For example, the solution can be coated onto the interlayer insulating film 2 and the first wiring layers 3a and 3b through two-step coating by varying the rotation speed in pre-spin and main spin. More specifically, the pre-spin is carried out at 500 rpm for 1.5 seconds and the main spin is carried out at 2000 rpm for 10 seconds.

The semiconductor substrate 1 onto which the precursor film of the insulating film has been coated is then placed on a hot plate to perform a thermal treatment (baking) in an atmosphere of an inert gas. Thus, the resin film 4 is converted into a pre-ceramic silicon oxide film 4a. For example, the thermal treatment is carried out in an atmosphere of $N_2$ gas at a temperature ranging from 150° C. to 400° C. for 1 to 60 minutes.

Specifically, the thermal treatment was performed using the hot plate in the $N_2$ gas atmosphere at 150° C. for 1 minute, at 200° C. for 1 minute and at 300° C. for 1 minute.

The heating temperature is preferably not higher than 400° C. so as to maintain the fluidity of the hydrogen silsesquioxane resin and to surely prevent the generation of microscopic projections. The conversion into the pre-ceramic film can be carried out by heating for about 1 minute, as long as the temperature is within the range of 250° C. to 400° C.

In the next step, the semiconductor substrate 1 is calcined in a calcination oven so that a crosslinking reaction occurs in the pre-ceramic silicon oxide film 4a for converting it into a ceramic film. After replacing an atmosphere in the calcination oven with an inert gas, the pre-ceramic silicon oxide film 4a is calcined at a temperature ranging from 350° C. to 450° C. for about 1 to 60 minutes to form a ceramic silicon oxide film 4b. After the calcination is finished, the pressure is reduced to about $1 \times 10^{-1}$ Pa.

In the embodiment of the present invention, the semiconductor substrate 1 is introduced in the calcination oven at 200° C. and then 20 liter of $N_2$ gas is supplied to replace the atmosphere in the oven with an inert gas. Then, the calcination is carried out under almost atmospheric pressure ($0.1 \times 10^{+6}$ Pa), that is, between $0.07 \times 10^{+6}$ Pa and $0.13 \times 10^{+6}$ Pa at 400° C. for 60 minutes. After the calcination is finished, the temperature is lowered and the pressure in the calcination oven is reduced to $3 \times 10^{-1}$ Pa simultaneously. When the temperature is lowered to 200° C. in 120 minutes under the reduced pressure, the inert gas atmosphere is turned back to the atmosphere and the semiconductor substrate is taken out of the oven.

According to the thus performed pressure reduction, the generation of the microscopic projections was not resulted on the surface of the ceramic silicon oxide film 4b.

Then, an insulating film 5 made of silicon oxide ($SiO_2$) of 500 nm thick is formed by plasma CVD method so as to cover the ceramic silicon oxide film 4b (FIG. 1(b)). For example, the formation of the insulating film 5 is carried out at a substrate temperature of 400° C. under pressure in a reactor of 293 Pa using material gases of $SiH_4$ (240 sccm), $N_2O$ (5000 sccm) and $N_2$ (2800 sccm).

Then, a resist layer 6 is formed on the insulating film 5 (FIG. 1(c)). The resist layer 6 has first contact holes 7a and 7b corresponding to desired second contact holes 8a and 8b. Using the resist layer 6 as a mask, selective dry etching (anisotropic etching) is carried out to open the second contact holes 8a and 8b extending to the first wiring layers 3a and 3b (FIG. 1(d)). The second contact holes 8a and 8b can be formed into a proper shape without generating a concave portion as the reference numeral 25 shown in FIG. 3(d) because partial dissolution of the silicon oxide film 4b does not occur.

Figure 3A:
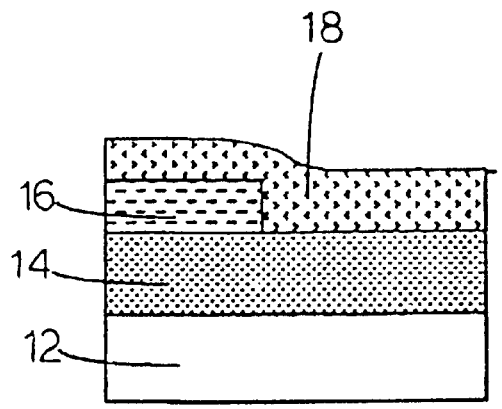
FIGS. 3(a) to 3(d) are sectional views for illustrating the steps for manufacturing a semiconductor device according to the prior art.
Figure 3C:
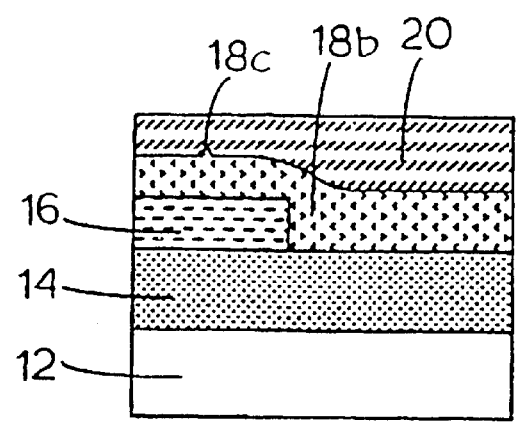
Figure 3B:
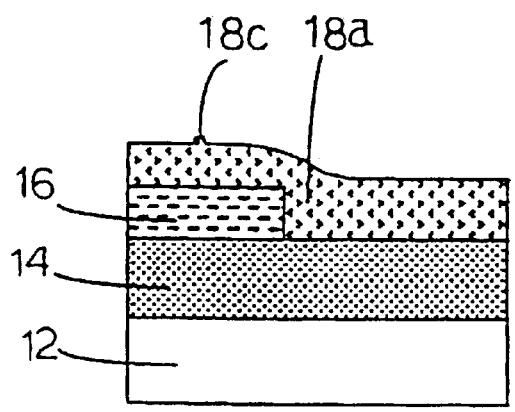
Figure 3D:
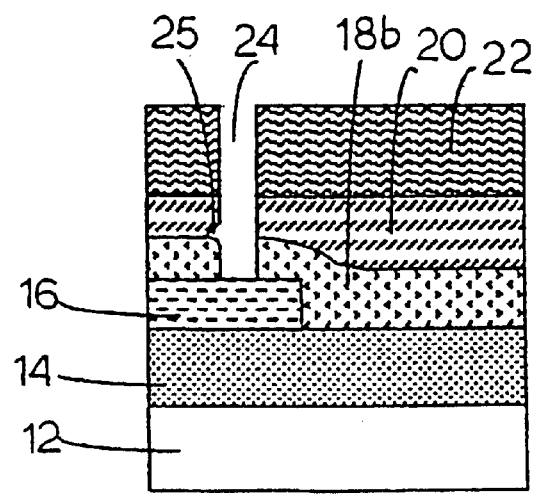

Next, a wiring material layer is formed on the substrate surface by sputtering method or the like and patterned by selective dry etching (anisotropic etching) to form second wiring layers 9a and 9b on the insulating film 5 (FIG. 1(e)). The second wiring layers 9a and 9b are connected to the first wiring layers 3a and 3b via the second contact holes 8a and 8b, respectively. An Al—Si—Cu material was deposited as the wiring material to the thickness of 400 nm. Since the second contact holes 8a and 8b are formed in a proper shape, the second wiring layers 9a and 9b can also be formed with favorable step coverage. Even though the contact holes are formed closer, short circuit can be inhibited because a portion as the concave portion 25 shown in FIG. 3(d) is not generated.

With respect to the insulating film 5, which is the uppermost interlayer insulating film between the first wiring layers 3a and 3b and the second wiring layers 9a and 9b, it is desired that the insulating film 5 hardly generates cracks, exhibits low moisture absorbency and is capable of being formed at low temperature. An insulating film formed by plasma CVD method, sputtering method and the like, which are not excellent in step coverage, satisfies the above-mentioned conditions. Therefore such an insulating film is suitable for use as the insulating film 5.

Examination was carried out using a counter capable of detecting a microscopic projection of about 0.1 μm in diameter so as to obtain the frequency of the generation of the microscopic projections. The frequency was quantified.

FIG. 2 illustrates the results of the measurement by the counter for each sample. The horizontal axis shows the reduced pressure and the vertical axis shows the count of the microscopic projections detected by the counter. Referring to FIG. 2, the microscopic projections increase when the pressure after the calcination for forming the ceramic film is $1 \times 10^{+3}$ Pa or more. The microscopic projections do not occur when the pressure is less than $1 \times 10^{+3}$ Pa.

As described above, according to the present invention, the generation of the microscopic projections on the surface of the inorganic SOG film having Si—H bonding can be prevented by reducing the pressure after the calcination.

If the inorganic SOG film having Si—H bonding according to the present invention is used as an interlayer film or a protective film in a semiconductor device, deterioration of formation of the contact holes can be avoided and favorable flatness can be obtained.

What is claimed is:

1. A method for forming an insulating film, the method comprising:

forming a precursor insulating film comprising Si—H bonding, wherein the insulating film is formed on a semiconductor substrate over at least a first wing, or an insulating layer and first wiring;

calcining the precursor insulating film in an atmosphere comprising at least one of an inert gas and oxygen gas so as to convert die precursor insulating film into a ceramic film; and cooling the ceramic film under a reduced pressure of from $1 \times 10^{-1}$ to $1 \times 10^{+3}$ Pa, said reduced pressure being less than a calcination pressure(s) at which the calcining was performed.

2. A method according to claim 1, wherein the ratio of the reduced pressure to the pressure for the calcination (reduced pressure/calcination pressure) is from $10^{-3}$ to $10^{-7}$.

3. A method according to claim 1, wherein the calcination pressure is $0.07 \times 10^{+6}$ Pa to $0.13 \times 10^{+6}$ Pa.

4. A method according to claim 1, wherein the calcination is carried out at a temperature of 350° C. to 450° C. for 1 to 60 minutes.

5. A method according to claim 1, wherein the cooling is performed until the temperature reaches 200° C. to 350° C.

6. A method according to claim 1, wherein the ceramic film is a Spin-On-Glass film.

7. A method according to claim 1, wherein the precursor film is subjected to a thermal treatment in an atmosphere containing at least one of an inert gas and oxygen gas for converting into a pre-ceramic film prior to the calcination for converting into the ceramic film.

8. A method according to claim 7, wherein the thermal treatment is carried out at a temperature of 250° C. to 400° C. for 1 to 60 minutes.

9. An method according to claim 1, wherein the precursor film is of a hydrogen silsesquioxane resin.

10. A method of making a semiconductor device, the method comprising:

forming a wiring on a semiconductor substrate;

forming a precursor insulating film comprising Si—H bonding on the semiconductor substrate over at least the wiring;

calcining the precursor insulating film in an atmosphere comprising at least one of an inert gas and oxygen gas so as to convert the precursor insulating film into a ceramic film; and cooling the ceramic film under a reduced pressure of from $1 \times 10^{-1}$ to $1 \times 10^{-3}$ Pa.

11. The method of claim 10, wherein the calcining is carried out at a pressure of from $0.07 \times 10^{+6}$ Pa to $0.13 \times 10^{+6}$ Pa.

* * * * *